(12) United States Patent
Seo et al.

(10) Patent No.: US 11,397,561 B2
(45) Date of Patent: Jul. 26, 2022

(54) NONVOLATILE MEMORY DEVICE PERFORMING A MULTIPLICAITON AND ACCUMULATION OPERATION

(71) Applicants: SK hynix Inc., Icheon (KR); Korea Advanced Institute of Science and Technology, Daejeon (KR)

(72) Inventors: Jin-O Seo, Uiwang (KR); Hyuk-Jin Lee, Suwon (KR); SeongHwan Cho, Daejeon (KR)

(73) Assignees: SK hynix Inc., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 305 days.

(21) Appl. No.: 16/854,759

(22) Filed: Apr. 21, 2020

(65) Prior Publication Data
US 2021/0072956 A1 Mar. 11, 2021

(30) Foreign Application Priority Data

Sep. 5, 2019 (KR) ........................ 10-2019-0109898
Apr. 13, 2020 (KR) ........................ 10-2020-0044466

(51) Int. Cl.
*G11C 7/00* (2006.01)
*G06F 7/544* (2006.01)
*G11C 16/04* (2006.01)
*G11C 16/30* (2006.01)
*G11C 16/32* (2006.01)
*G11C 16/24* (2006.01)

(52) U.S. Cl.
CPC ........ *G06F 7/5443* (2013.01); *G11C 16/0483* (2013.01); *G11C 16/24* (2013.01); *G11C 16/30* (2013.01); *G11C 16/32* (2013.01)

(58) Field of Classification Search
CPC ....... G11C 7/1051; G11C 7/22; G11C 7/1072; G11C 7/1006; G11C 7/1066
USPC .................................. 365/189, 15
See application file for complete search history.

(56) References Cited

U.S. PATENT DOCUMENTS 9,430,735 B1 8/2016 Vali et al.
2017/0271011 A1* 9/2017 Sasao ..................... G11C 15/04

FOREIGN PATENT DOCUMENTS

KR 10-2010-0034614 A 4/2010
KR 10-2019-0029406 A 3/2019

* cited by examiner

*Primary Examiner* — Son T Dinh (57) ABSTRACT

A nonvolatile memory device includes a memory cell array including a plurality of nonvolatile memory elements configured to store a plurality of weights and to be controlled according to a plurality of input signals respectively and a bit line coupled to the plurality of nonvolatile memory elements; and a computation output circuit configured to generate a computation signal corresponding to an inner product between an input vector corresponding to the plurality of input signals and a weight vector corresponding to the plurality of weights.

15 Claims, 9 Drawing Sheets

| VIN | VTH | VDS (V1>V2>V3) | IWP |
|---|---|---|---|
| VIN,H (0) | VTH,L (0) | V3 | 0 |
| VIN,H (0) | VTH,H (1) | V2 | 0 |
| VIN,L (1) | VTH,L (0) | V2 | 0 |
| VIN,L (1) | VTH,H (1) | V1 | 1 |

NONVOLATILE MEMORY DEVICE PERFORMING A MULTIPLICAITON AND ACCUMULATION OPERATION

CROSS-REFERENCE TO RELATED APPLICATIONS

The present application claims priority under 35 U.S.C. § 119(a) to Korean Patent Application No. 10-2019-0109898, filed on Sep. 5, 2019 and Korean Patent Application No. 10-2020-0044466, filed on Apr. 13, 2020, which are incorporated herein by reference in its entirety.

BACKGROUND

1. Technical Field

Various embodiments relate to a nonvolatile memory device performing a multiplication and accumulation (MAC) operation.

2. Related Art

Neural networks are widely used in artificial intelligence applications, such as image recognition and technologies used in autonomous vehicles.

In an example, a neural network includes an input layer, an output layer, and one or more inner layers between the input layer and the output layer.

Each of the output layer, the input layer, and the inner layers includes one or more neurons. Neurons contained in adjacent layers are connected in various ways through synapses. For example, synapses point from neurons in a given layer to neurons in a next layer. Alternately or additionally, synapses point to neurons in a given layer from neurons in a previous layer.

Each of the neurons stores a value. The values of the neurons included in the input layer are determined according to an input signal, for example, an image to be recognized. The values of the neurons contained in the inner and output layers are based on the neurons and synapses contained in corresponding previous layers. For example, the values of the neurons in each of the inner layers are based on the values of the neurons in a preceding layer in the neural network.

Each of the synapses has a weight. The weight of each of the synapses is based on a training operation of the neural network.

After the neural network is trained, the neural network can be used to perform an inference operation. In the inference operation, the values of the neurons in the input layer are set based on an input, and the values of the neurons in the next layers (e.g., the inner layers and the output layer) are set based on the values of the neurons in the input layer and the trained synapses connecting the layers. The values of the neurons in the output layer represent a result of the inference operation.

For example, in an inference operation, in which image recognition is performed by the neural network after the neural network has been trained, the values of the neurons in the input layer are set based on an input image, a plurality of operations are performed at the inner layers based on the values of the neurons in the input layer, and a result of the image recognition is output at the output layer from the inner layers.

In such an inference operation, a large number of MAC operations must be performed by the neurons in the convolutional neural network. As a result, an semiconductor device capable of efficiently performing a large number of MAC operations is desirable.

SUMMARY

In accordance with an embodiment of the present disclosure, a nonvolatile memory device may include a memory cell array including a plurality of nonvolatile memory elements configured to store a plurality of weights and to be controlled according to a plurality of input signals respectively and a bit line coupled to the plurality of nonvolatile memory elements; and a computation output circuit configured to generate a computation signal corresponding to an inner product between an input vector corresponding to the plurality of input signals and a weight vector corresponding to the plurality of weights.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

In the following disclosure, a nonvolatile memory device is disclosed using a flash memory device as an example, but the type of the nonvolatile memory device that may be used is not limited to the flash memory device.

Figure 1:
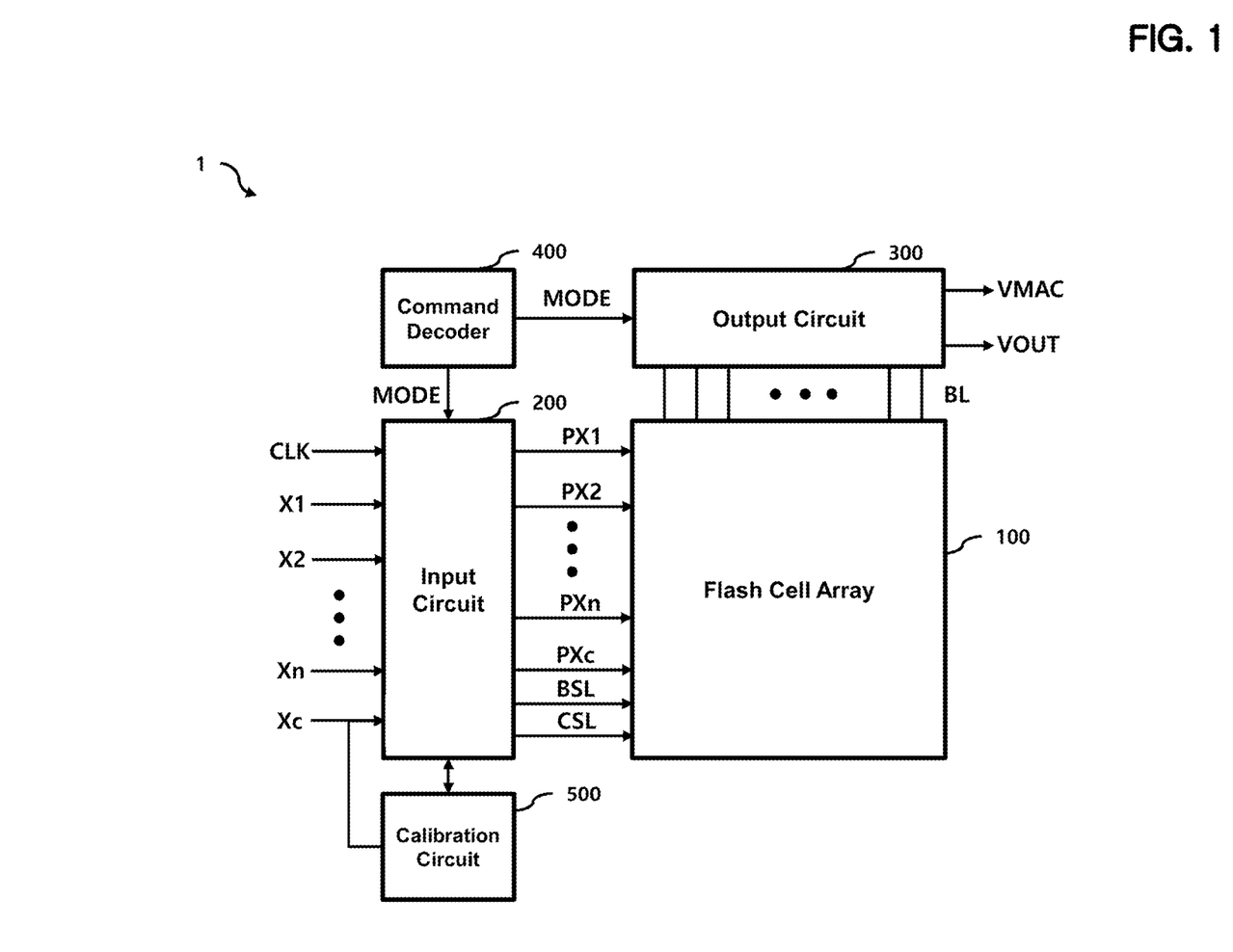
FIG. 1 illustrates a flash memory device according to an embodiment of the present disclosure.

FIG. 1 is a block diagram illustrating a flash memory device 1 according to an embodiment of the present disclosure.

The flash memory device 1 includes a flash cell array 100, an input circuit 200, an output circuit 300, a command decoder 400, and a calibration circuit 500.

The command decoder 400 controls a read operation, a program operation, and an erase operation in the same manner in which those operations are performed in a command decoder included in a conventional flash memory device.

In the present embodiment, the command decoder 400 additionally performs a control operation necessary for a computation operation.

The flash memory device according to the present embodiment has a memory operation mode and a computation operation mode.

In the memory operation mode, an operation of a general flash memory device is performed. In the computation operation mode, the MAC operation is performed.

The command decoder 400 may output a mode signal MODE to distinguish between a memory operation mode indicated by a logic value "0" and a computation operation mode indicated by a logic value "1".

The flash cell array 100 may be referred to as a memory cell array.

The flash cell array 100 includes a plurality of NAND strings, a plurality of bit lines, and a plurality of source lines.

Figure 2:
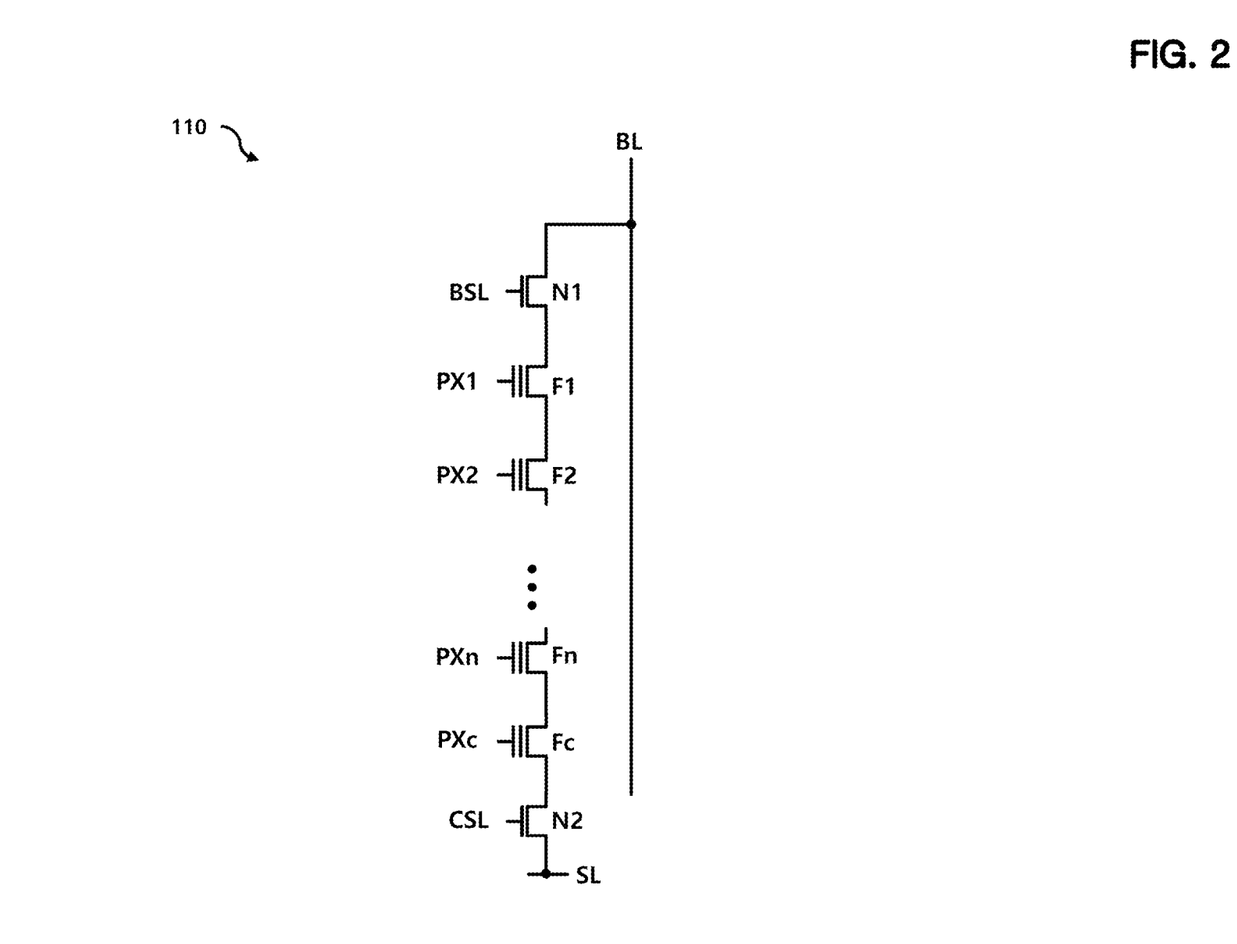
FIG. 2 illustrates a NAND string according to an embodiment of the present disclosure.

FIG. 2 illustrates a NAND string 110 according to an embodiment of the present disclosure, such as may be included in the flash cell array 100 of FIG. 1.

The NAND string 110 includes a plurality of flash cells F1, F2, ..., Fn, and Fc connected between a corresponding bit line BL and a corresponding source line SL.

Hereinafter, the NAND string may be referred to as a cell string and the flash cell may be referred to as a memory cell or a flash memory cell.

The NAND string 110 includes a bit line selection switch N1 coupling the flash cell F1 and the bit line BL, and a source line selection switch N2 coupling the flash cell Fc and the source line SL.

In the present embodiment, the flash cell Fc is used for a calibration operation and may be referred to as a calibration cell.

In this embodiment, the bit line selection switch N1 and the source line selection switch N2 are NMOS transistors.

The plurality of flash cells F1, F2, ..., Fm, and Fc may be floating gate flash cells or charge trap flash cells.

Each flash cell stores a weight, and storing of the weight may be performed in the program operation of the flash memory device 1.

In the illustrated embodiment, each flash cell stores a 1-bit weight. In another embodiment, each flash cell may store a multi-bit weight.

Figure 3A:
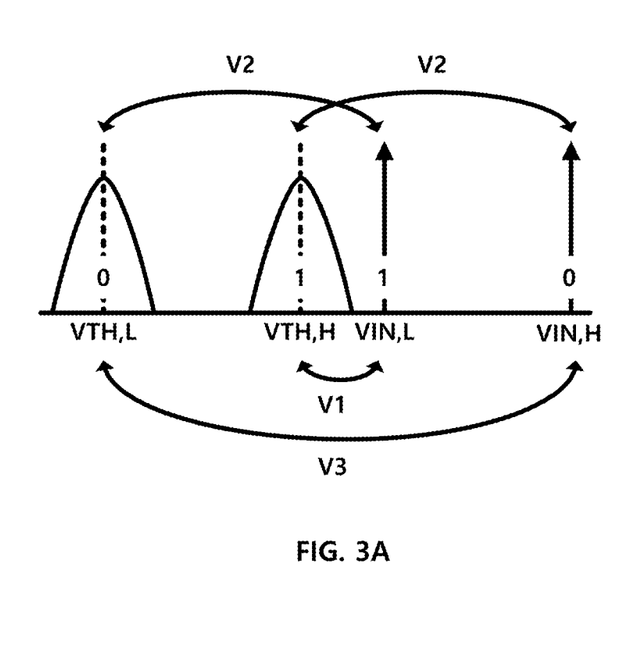
FIGS. 3A and 3B illustrate a computation operation using a flash memory cell according to an embodiment of the present disclosure.

FIG. 3A is a diagram showing a computation operation using the flash cell.

The flash cell has a low threshold voltage VTH,L or a high threshold voltage VTH,H depending on whether charge has been injected into the floating gate or the charge trap region.

In the present embodiment, when the threshold voltage is low (such as when the threshold voltage is the low threshold voltage VTH,L), the weight stored in the flash cell corresponds to a logic value "1", and when the threshold voltage is high (such as when the threshold voltage is the high threshold voltage VTH,H), the weight stored in the flash cell corresponds to a logic value "0".

In this case, when the input voltage VIN is applied to the gate of the flash cell, the drain-source voltage VDS of the flash cell varies according to the threshold voltage and the input voltage VIN.

At this time, the input voltage VIN may be set to a low input voltage VIN,L or a high input voltage VIN,H.

In the present embodiment, the low input voltage VIN,L corresponds to a logic value "1", and the high input voltage VIN,H corresponds to a logic value "0".

As shown in FIG. 3A, the low input voltage VIN,L is set lower than the high input voltage VIN,H and higher than the high threshold voltage VTH,H.

For example, the low threshold voltage VTH,L may be distributed between 0V and 1V, and the high threshold voltage VTH,H may be distributed between 4V and 5V. Also, the low input voltage VIN,L may be 7V and the high input voltage VIN,H may be 11V.

Accordingly, the flash cell is turned on regardless of the level of the input voltage VIN, but the magnitude of the turn-on resistance of the flash cell may vary according to the magnitude of the input voltage VIN and the threshold voltage of the flash cell.

Figure 3B:
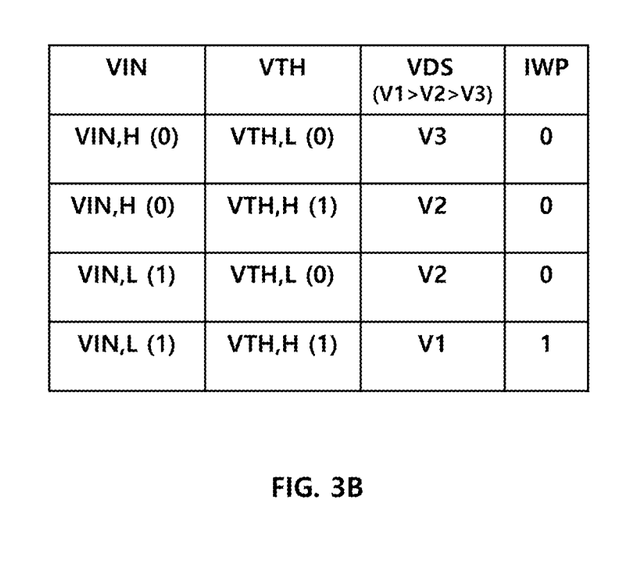

FIG. 3B illustrates a table showing various values of the drain-source voltage VDS of the flash cell according to the input voltage VIN and the threshold voltage VTH. The table assumes a constant current is being provided through the flash cell.

In the table, a product signal IWP corresponds to the product of the input voltage VIN and the threshold voltage VTH. In the present embodiment, the input voltage VIN and the threshold voltage VTH are 1-bit signals, respectively (that is, each carries 1 bit of information), and the product signal IWP therefore has a value of "0" or "1".

The drain-source voltage VDS may be classified into three cases.

A value "V1" of the drain-source voltage VDS, which is the largest value, corresponds to the low input voltages VIN,L and the high threshold voltage VTH,H, which correspond to a case where the turn-on resistance of the flash cell is large because the difference between the input voltage VIN and threshold voltage VTH is small.

A value "V2" of the drain-source voltage VDS, which is intermediate, corresponds to the low input voltage VIN,L and the low threshold voltage VTH,L or the high input voltage VIN,H and the high threshold voltage VTH,H, which corresponds to a case where the turn-on resistance of the flash cell is medium.

A value "V3" of the drain-source voltage VDS, which is the smallest value, corresponds to a high input voltage VIN,H and a low threshold voltage VTH,L, which corresponds to a case where the turn-on resistance of the flash cell is the smallest because the difference between the input voltage VIN and threshold voltage VTH is largest.

In the present embodiment, when the drain-source voltage VDS is V2 or V3, the product signal IWP generated by the flash cell corresponds to "0". Because V2 and V3 have different levels even though they corresponds to the same product signal, a calibration operation to adjust the drain-source voltage VDS levels is performed in the embodiment. The calibration operation will be described in detail below.

In this embodiment, the NAND string 110 includes a plurality of flash cells connected in series. In this case, the maximum drain-source voltage of each flash cell during the computation operation (i.e., V1) is preferably set to be very small compared to the magnitude of the input voltage. The maximum drain-source voltage of the flash cell may be controlled, for example, by the design of the flash cell, by controlling the value of the high threshold voltage VTH,H, by controlling the value of the low input voltage VIN,L, by controlling the magnitude of the current passing through the flash cells, or combinations thereof.

As a result of the maximum drain-source voltage of each flash cell during the computation operation (i.e., V1) being set to be very small compared to the magnitude of the input voltage, a voltage difference between the input voltage and the threshold voltage of a specific flash cell is not substantially affected by drain-source voltages of flash cells located below the specific flash cell.

In the computation operation mode, the NAND string is provided with a constant current. If the magnitude of the current is I and the maximum resistance of a flash cell is R1, the following conditions are preferable.

$$I \ll \frac{VIN, L - VTH, H}{R1} \quad \text{[Equation 1]}$$

For example, when the drain-source voltages of all flash cells becomes V1, the bit line voltage becomes at its maximum, and it is desirable to set this maximum to be much smaller than the difference between the low input voltage VIN,L and the high threshold voltage VTH,H. In one embodiment, the maximum value of the bit line voltage may be set to be smaller than 100 mV.

In the present embodiment, the bit line selection switch N1 is controlled by the bit line selection signal BSL and the source line selection switch N2 is controlled by the source line selection signal CSL.

In the present embodiment, the bit line selection signal BSL and the source line selection signal CSL may be provided by the input circuit 200, but the configuration that provides the bit line selection signal BSL and the source line selection signal CSL may be variously changed.

The input circuit 200 provides the input signals X1, X2, ..., Xn and Xc to the flash cell array 100 according to the mode signal MODE.

Figure 4:
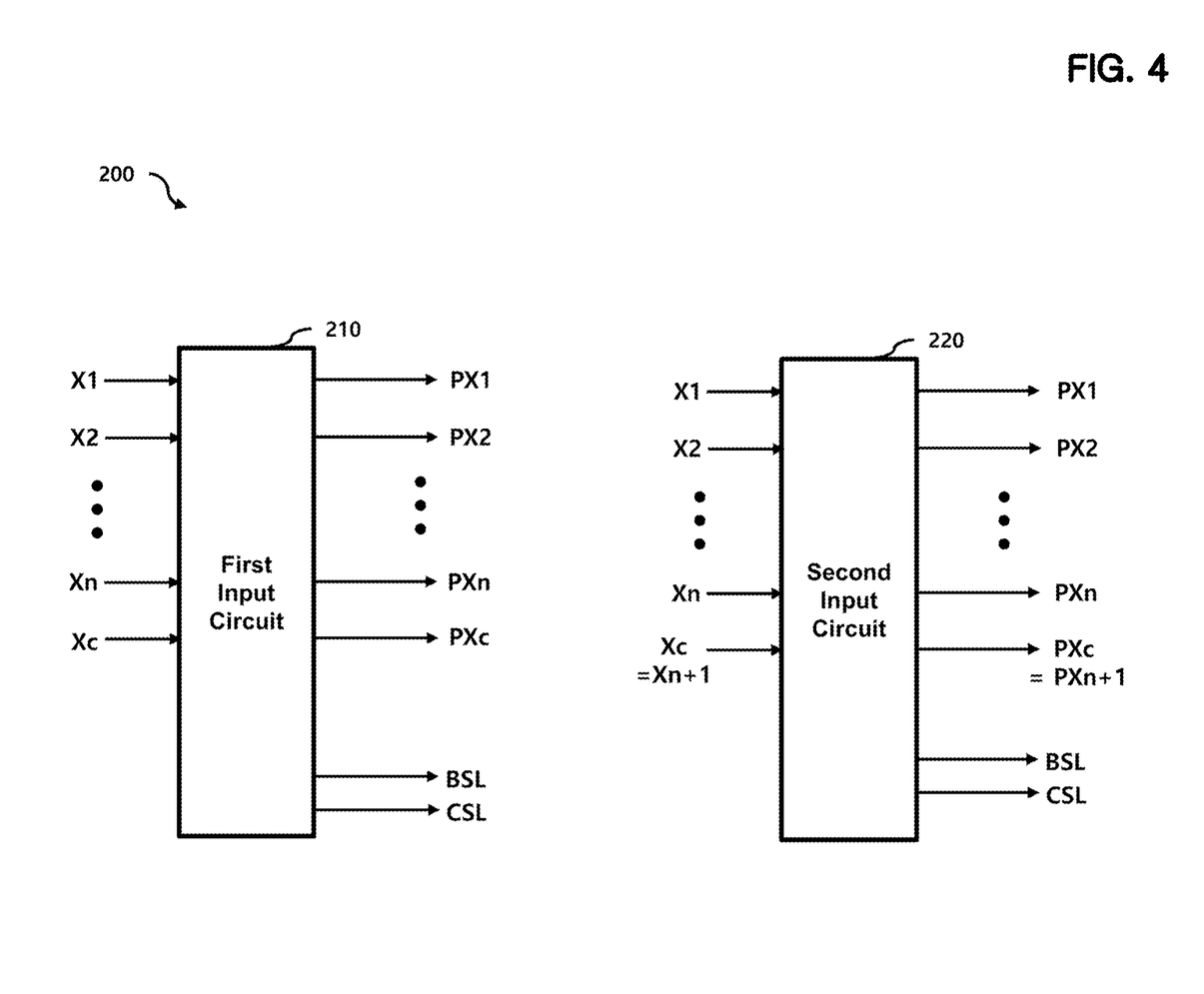
FIG. 4 illustrates an operation of an input circuit according to an embodiment of the present disclosure.

FIG. 4 is a block diagram of the input circuit 200 according to an embodiment of the present disclosure.

In this embodiment, the input circuit 200 includes a first input circuit 210 used in the computation operation mode and a second input circuit 220 used in the memory operation mode.

The second input circuit 220 provides read voltages or pass voltages to the flash cell array 100 as word line signals PX1, PX2, ..., PXn, and PXc according to the input signals X1, X2, ..., Xn, and Xc.

The input signal Xc may be denoted as Xn+1 as the (n+1)-th input signal and the word line signal PXc may be denoted as PXn+1 as a signal corresponding to the (n+1)-th input signal.

In the process of performing the computation operation mode, a programming operation and an erase operation may be controlled.

Since this operation corresponds to a normal memory operation, it may be performed using the second input circuit 220.

That is, the second input circuit 220 may also be used for the memory operation required during the computation operation mode.

The technique of providing a word line signal in accordance with an input signal in the memory operation mode is well known in the art, and thus a detailed description thereof will be omitted.

The first input circuit 210 converts the input signals X1, X2, ..., Xn into pulse input signals PX1, PX2, ..., PXn in the computation operation mode.

In the computation operation mode, the input signal Xc is used for calibration and may be referred to as a calibration signal Xc.

In the computation operation mode, the input signals X1, X2, ..., Xn may each be provided as respective multi-bit signals.

In this embodiment, the pulse input signals PX1, PX2, ..., PXn, and PXc are pulse signals having pulse widths corresponding to the values of the corresponding input signals X1, X2, ..., Xn, and Xc, respectively.

In the computation operation mode, the pulse input signal PXc may be referred to as a pulse calibration signal PXc.

In the present embodiment, the input signals X1, X2, ..., Xn are signals that are externally input and the input signal Xc is provided by the calibration circuit 500.

The calibration circuit 500 may perform a calibration operation using weight information of flash cells included in the NAND string and values of the input signals X1, X2, ..., Xn. The operation of the calibration circuit 500 will be described in detail below.

Figure 5:
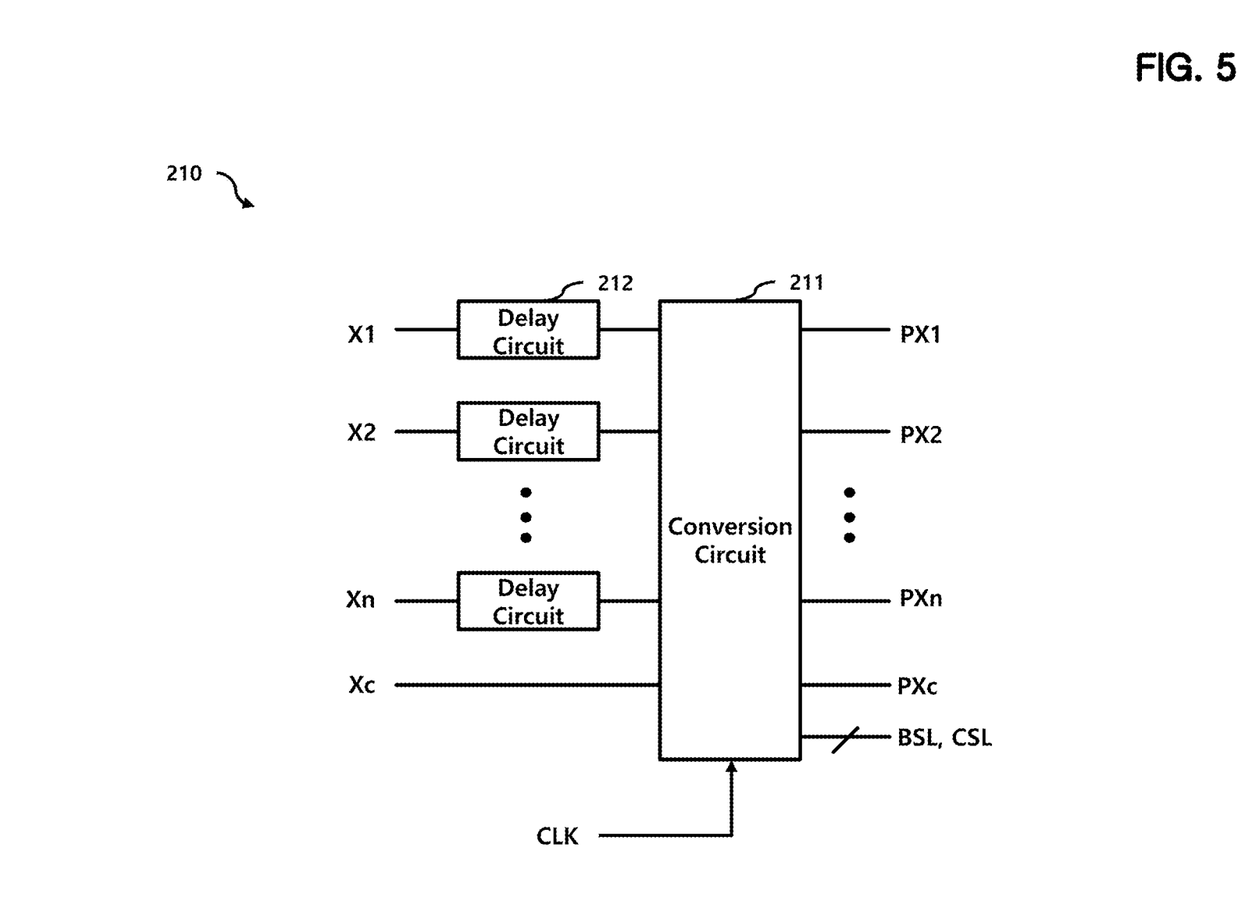
FIG. 5 illustrates a first input circuit according to an embodiment of the present disclosure.

FIG. 5 is a block diagram illustrating a first input circuit 210 according to an embodiment of the present disclosure.

The first input circuit 210 includes a conversion circuit 211 and a delay circuit 212 that delays the input signals X1, X2, ..., Xn and provides delayed input signals to the conversion circuit 211.

The delay element 212 delays input of the input signals X1, X2, ..., Xn into the conversion circuit 211 until the value to be used to control the calibration signal Xc is determined. In an embodiment, the input signals X1, X2, ..., Xn are provided to the calibration circuit 500 without being delayed by the delay element 212.

As described above, in this embodiment, the pulse input signals PX1, PX2, ..., PXn, and PXc are pulse signals having pulse widths corresponding to the values of the input signals X1, X2, ..., Xn, and Xc respectively.

Figure 8:
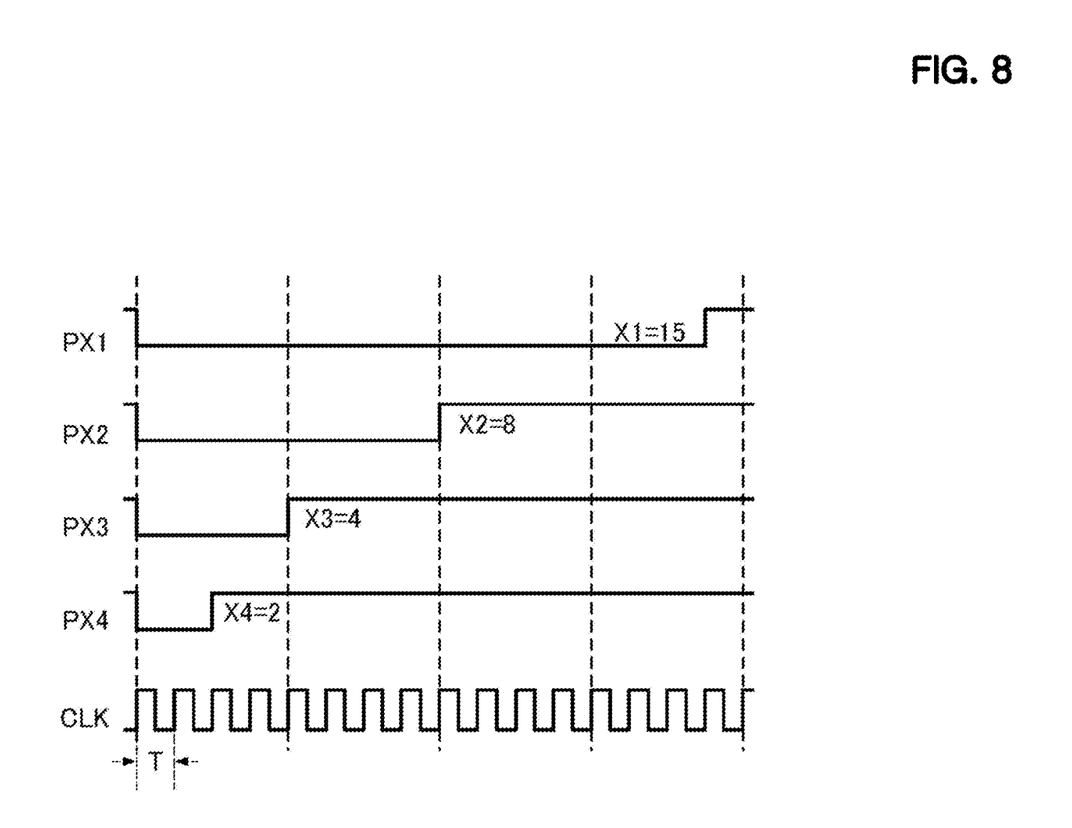
FIG. 8 illustrates a timing diagram showing an operation of a conversion circuit according to an embodiment of the present disclosure.

FIG. 8 is a timing diagram illustrating an operation of the conversion circuit 211 in the computation operation mode according to an embodiment of the present disclosure.

In FIG. 8, X1 is "1111" (i.e., 15), X2 is "1000" (i.e., 8), X3 is "0100" (i.e., 4), and X4 is "0010" (i.e., 2).

When a period of the clock signal CLK input to the conversion circuit 211 is T, PX1 is a low level pulse having a width of 15T, PX2 is a low level pulse having a width of 8T, and PX3 is a low level pulse having a width of 4T, and PX4 is a low level pulse having a width of 2T. In an embodiment, low levels of the pulse input signals PX1, PX2, ..., PXn, and PXc during the computation operation are equal to the low input voltage VIN,L, and high levels of the pulse input signals PX1, PX2, ..., PXn, and PXc during the computation operation are equal to the high input voltage VIN,H.

Referring back to FIG. 1, the output circuit 300 is connected to the bit line BL of the flash cell array 300 to output the data signal VOUT in the memory operation mode and to output the computation signal VMAC in the computation operation mode.

Figure 6:
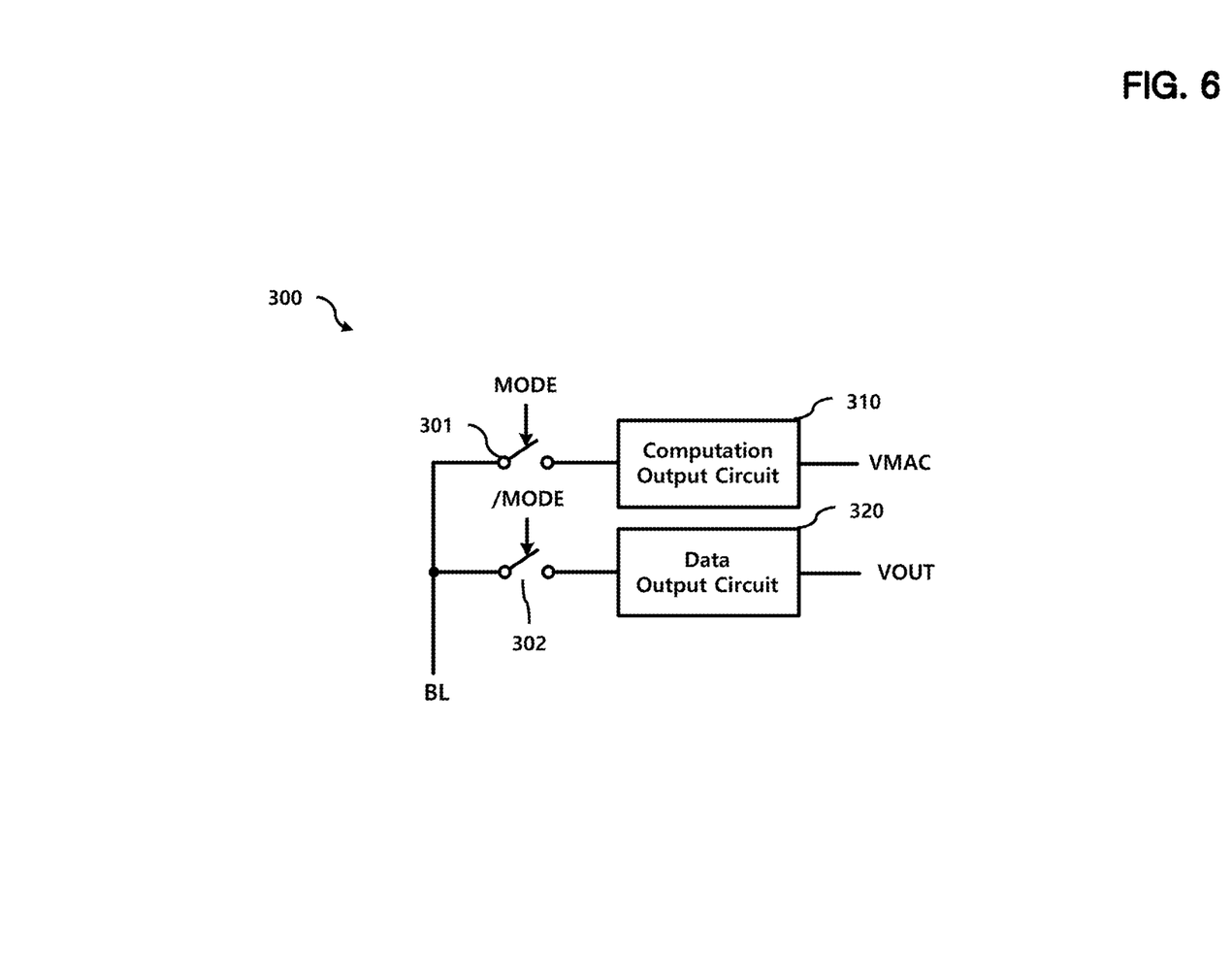
FIG. 6 illustrates an output circuit according to an embodiment of the present disclosure.

FIG. 6 is a block diagram illustrating an output circuit 300 according to an embodiment of the present disclosure.

The output circuit 300 includes a first switch 301, a second switch 302, a computation output circuit 310, and a data output circuit 320.

In the present embodiment, the first switch 301 is turned on in response to the mode signal MODE being at the high level, and the second switch 302 is turned on in response to the mode signal MODE being at the low level.

The computation output circuit 310 outputs a computation signal VMAC based on the bit line voltage VBL output from the bit line BL.

The data output circuit 320 outputs the data signal VOUT based on the bit line voltage VBL.

Since the configuration and operation of the data output circuit 320 are substantially the same as in the conventional flash memory device, a detailed description thereof will be omitted.

Figure 7:
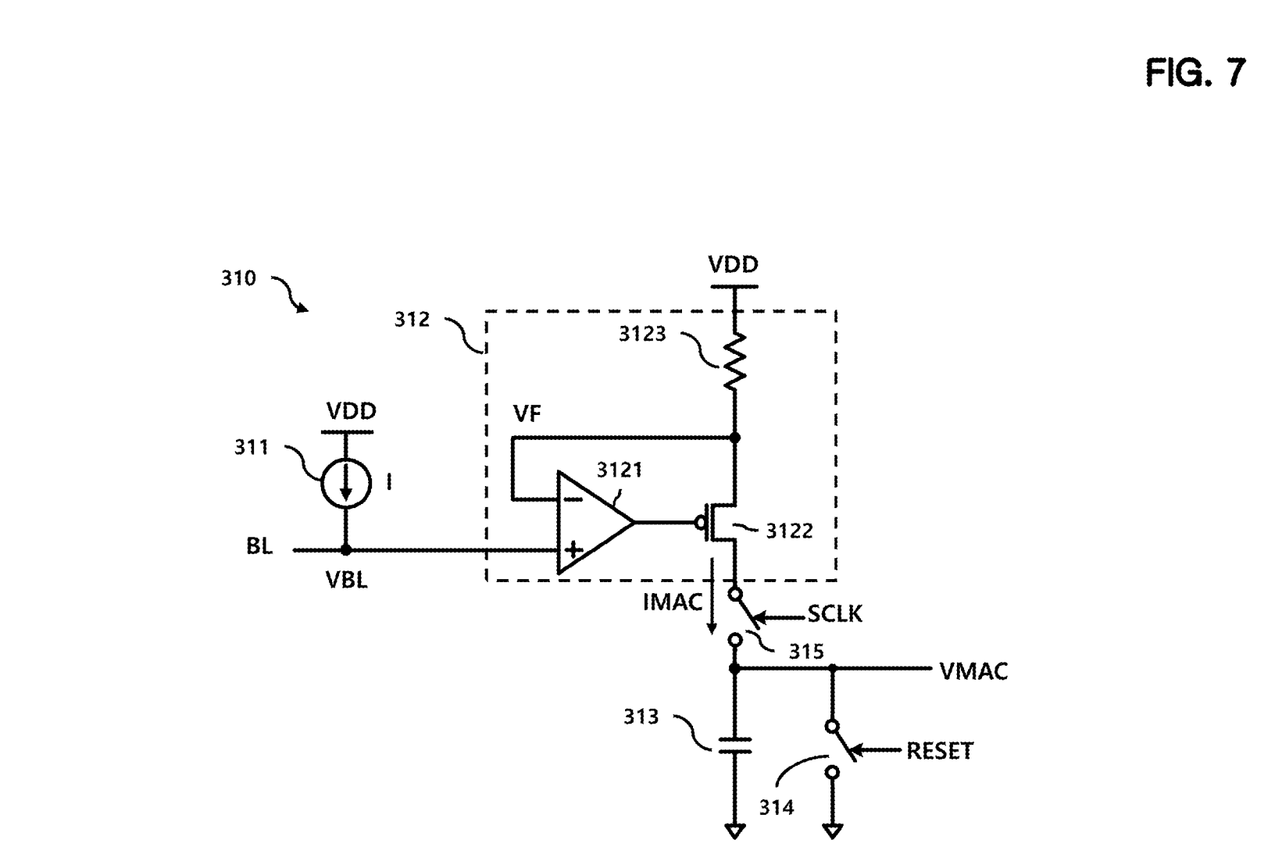
FIG. 7 illustrates a computation output circuit according to an embodiment of the present disclosure.

FIG. 7 is a circuit diagram illustrating a computation output circuit 310 according to an embodiment of the present disclosure.

The computation output circuit 310 includes a first current source 311 that provides a constant current I to the NAND string 110 through the bit line BL, and a second current source 312 controlled by the bit line voltage VBL.

The computation output circuit 310 further includes a capacitor 313 that is charged by computation current IMAC provided from the second current source 312 and outputs the computation signal VMAC, and a reset switch 314 for discharging the capacitor 313 according to the reset signal RESET.

The computation output circuit 310 may further include a sampling switch 315 coupling the second current source 312 and the capacitor 313 according to the sampling clock signal SCLK.

In this embodiment, the sampling clock signal SCLK has the same frequency as the clock signal CLK input to the input circuit 200.

The sampling clock signal SCLK may have a predetermined phase difference from the clock signal CLK.

The second current source 312 includes an operational amplifier 3121 for amplifying voltage difference between the bit line voltage VBL and the feedback voltage VF, a PMOS transistor 3122 including a gate receiving output voltage of the operational amplifier 3121 and a source receiving the computation current IMAC, and a resistor 3213 connected between the source of the PMOS transistor 3122 and the power supply voltage VDD.

The bit line voltage VBL is input to the positive input terminal of the operational amplifier 3121 and the feedback voltage VF which is a source voltage of the PMOS transistor 3122, is fed back to the negative input terminal of the operational amplifier 3121. Accordingly, the second current source 312 produces a computation current IMAC that increases as the bit line voltage VBL decreases, and decreases as the bit line voltage VBL increases.

The computation output circuit 310 may further include an analog-to-digital converter (not shown) for converting the computation signal VMAC into a digital signal.

The computation output circuit 310 may further include a circuit for adjusting the level of the computation signal VMAC, such as by adding or subtracting an offset from the computation signal VMAC, amplifying the computation signal VMAC, or both.

Figure 9:
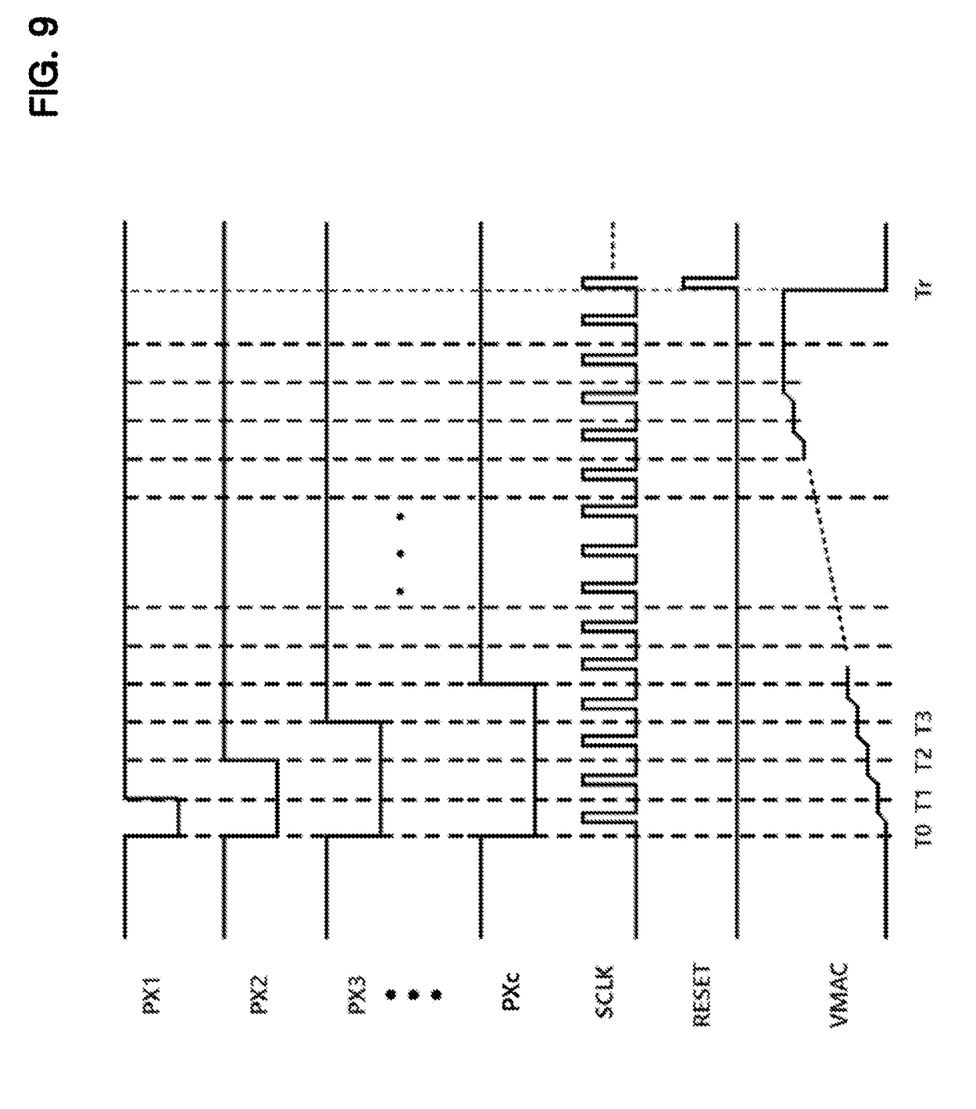
FIG. 9 illustrates a timing diagram showing a computation operation of a flash memory device according to an embodiment of the present disclosure.

FIG. 9 is a timing diagram illustrating a computation operation of a flash memory device according to an embodiment of the present disclosure.

Computation operation is performed during a computation cycle from T0 to Tr. In the time before T0, a calibration operation is performed as described herein to determine a calibration value C used to control the pulse calibration signal PXc.

When the period of the sampling clock SCLK is T and number of bits of the input signal is m, the computation cycle should be as long as at least $(2^m-1)$ T. In this embodiment, the computation cycle is assumed to have a duration of $(2^m-1)$ T.

In FIG. 9, the pulse input signal PX1 is a pulse signal having a low level between T0 and T1, the pulse input signal PX2 is a pulse signal having a low level between T0 and T2, and the pulse input signal PX3 is a pulse signal having a low level between T0 and T3. The durations of the low levels of the pulse input signals PX1, PX2, PX3, . . . are determined according to the input signals X1, X2, X3, . . . , respectively. The pulse calibration signal PXc has a low level starting at T0 and having a duration corresponding to the calibration value C.

As described above with reference to FIG. 3, given a constant current provided by the first current source 311 of the computation output circuit 310 of FIG. 7, the drain-source voltage of each flash cell is determined to be one of V1, V2, and V3 according to the value of pulse input signal supplied to the flash cell and the weight value stored in (corresponding to the threshold voltage of) the flash cell, and the bit line voltage VBL is determined by the sum of drain-source voltages of the flash cells.

In the present embodiment, the sample clock signal SCLK used by the conversion circuit 211 is a signal having the same frequency as the clock signal CLK and having a different phase from the clock signal CLK.

In FIG. 9, a width of the low level interval of a pulse input signal is determined as a multiple of a period of the clock signal CLK or the sample clock signal SCLK, according to a respective input value.

The sample clock signal SCLK is generated by delaying the clock signal CLK so that the high level interval of the sample clock signal SCLK does not overlap with the transition of the pulse input signal. As a result, the sample clock signal SCLK has one or more high level intervals during a low level interval of each pulse input signal.

In an embodiment in which the sample switch 315 is used as shown in FIG. 7, the capacitor 313 is charged by the computation current IMAC generated by the second current source 312 only during intervals where the sample clock signal SCLK is at the high level.

Accordingly, in FIG. 9, the computation signal VMAC rises during each interval in which the sample clock signal SCLK is at the high level and maintains a constant level during each interval in which the sample clock signal SCLK is at the low level.

An interval in which the sample clock signal SCLK is at the high level may be referred to as a sample interval.

In FIG. 9, for each sample period, the bit line voltage VBL may have a different value according to the number of pulse input signals having the low level during that sample period and the weights of the flash cells. As a result, the shape of the computation signal VMAC may vary according to the shape of the pulse input signals and the weight stored in each flash cell.

After time Tr, the reset signal is activated in synchronization with the sample clock signal SCLK, thereby discharging the capacitor 313 to initialize the computation signal VMAC for the next computation.

Hereinafter, the operation of the calibration circuit 500 will be described.

As described above, when the drain-source voltage VDS is V2 or V3 of the flash cell, the product signal IWP is considered to be "0".

In the embodiment, a calibration operation is performed to adjust the drain-source voltage to be effectively equal to a predetermined voltage when the product signal IWP has a value of "0".

In this embodiment, the calibration operation is performed to effectively adjust the drain-source voltage to be V2 when the product signal IWP has a value of "0". That is, the calibration operation is performed for a case where the drain-source voltage becomes V3 to adjust the drain-source voltage to effectively be V2.

The threshold voltage of the calibration cell Fc is set to have the high threshold voltage VTH,H.

A calibration operation is performed by the calibration circuit 500 after the input signals X1, X2, . . . , Xn are received and before the computation operation is performed. After the calibration operation, the pulse calibration signal PXc is controlled during the computation operation to have the low level VIN,L during C cycles and to have the high level VIN,H during the remainder of the computation operation, wherein C is a calibration value produced by the calibration operation.

For the calibration operation, numbers of cases each corresponding to a combination of the input voltage VIN and the threshold voltage VTH are counted for the pulse input signals PX1, PX2, . . . , PXn derived from the input signals X1, X2, . . . , Xn. In an embodiment, the number of times that a drain-source voltage across a flash cell will be equal to V3 in a computation operation is determined and that number used to determine a calibration value for the computation operation.

As shown in Table 1, below, for the flash cells of the high threshold voltage VTH,H, the number of intervals where the pulse input voltage VIN is at the low level is represented as N1, for the flash cells of the high threshold voltage VTH,L, the number of intervals where the pulse input voltage VIN is at the low level is represented as N2, for the flash cells of the high threshold voltage VTH,H, the number of intervals where the pulse input voltage VIN is at the high level is represented as N3, and for the flash cells of the high threshold voltage VTH,H, the number of intervals where the pulse input voltage VIN is at the high level is represented as N4. Because the number N4 corresponds to a number of times that drain-source voltages for a case of IWP=0 is V3 instead of the target value of V2, an error corresponding to N4×(V2−V3) will be present in the output unless calibration is used.

Next, numbers of cases each corresponding to a combination of the input voltage VIN and the threshold voltage VTH are determined for the pulse calibration signal PXc derived from the calibration signal Xc. In particular, N4, which corresponds to a sum of a number of times during the computation operation that a drain-source voltages is V3 because a pulse input signal $PX_i$ is the high input voltage VIN,H when the corresponding flash cell $F_i$ has a low threshold voltage VTH,L for i=1 . . . n, is determined.

The calibration circuit 500 computes N4 using the weights $W_1$ . . . $W_n$ stored in the flash cells and the values of the input signals $x_1$ . . . $x_n$ during the computation operation. In an embodiment, the calibration circuit sums the ones-complement of the input signals $x_i$ that have a corresponding weight $W_i$ of 0. Accordingly, $$N4 = \sum_{i=1}^{n} \begin{cases} 2^p - 1 - x_i & \text{when } W_i = 0 \\ 0 & \text{when } W_i = 1 \end{cases}$$ [Equation 2]

wherein p is the number of bits in the input signals and n is the number of input signals.

In an embodiment, the values of the weights $W_1$ . . . $W_n$ are stored in registers in the calibration circuit 500 before the calibration operation is performed. For example, the values of the weights $W_1$ . . . $W_n$ may be stored in the calibration circuit 500 as they are being programmed into the flash cells.

The threshold voltage of the calibration cell Fc is fixed to the high threshold voltages VTH,H. Accordingly, the drain-source voltage across the calibration cell Fc will be the highest drain-source voltage V1 when the pulse calibration signal PXc is the low input voltage value VIN,L (corresponding to a logic 1) and will be the middle drain-source voltage V2 when the pulse calibration signal PXc is the high input voltage value VIN,H (corresponding to a logic 0).

Accordingly, when the value of the calibration signal Xc is C and m is the number of bits of the calibration signal Xc, the number of intervals having the low level in the pulse calibration signal PXc corresponding to the calibration signal Xc is C and the number of intervals at the high level is $2^m-1-C$.

TABLE 1

| VIN | VTH | VDS | Number of intervals derived from pulse input signals | Number of intervals derived from calibration signal |
|---|---|---|---|---|
| VIN, L(1) | VTH, H(1) | V1 | N1 | C |
| VIN, L(1) | VTH, L(0) | V2 | N2 | 0 |
| VIN, H(0) | VTH, H(1) | V2 | N3 | $2^m - 1 - C$ |
| VIN, H(0) | VTH, L(0) | V3 | N4 | 0 |

The total bit line voltage VBL generated during one computation cycle in the absence of calibration may be expressed as in Equation 3 below, which corresponds to the result of the MAC operation.

In the following equations, the drain-source voltages of the bit line selection switch and the source line selection switch are ignored.

VBL=N1·V1+(N2+N3)·V2+N4×V3 [Equation 3]

When the calibration operation is performed, that is, when considering the operation of the flash cell Fc of the NAND string, the bit line voltage VBL may be given by Equation 4.

VBL=(N1+C)×V1+(N2+N3+$2^m$−1−C)×V2+N4×V3 [Equation 4]

When the calibration operation is performed, the calibration cell Fc should not negatively affect the computation result, but should instead compensate for the difference between drain-source voltage V2 and drain-source voltage V3.

Accordingly, by plugging the calibration value C given in Equation 6, below, into Equation 4, above, the bit line voltage that results after performing the calibration operation and the computation operation is given in Equation 5.

VBL=N1×V1+(N2+N3+N4+$2^m$−1)×V2 [Equation 5]

The values of Equations 4 and 5 representing the calibration result should be identical to each other, and accordingly as the error being corrected is equal to N4·(V2−V3) and the difference in the bit line voltage between the pulse calibration signal PXc being high and low is V1−V2, the error is compensated for by the pulse calibration signal PXc when N4·(V2−V3)=C·(V1−V2), from which the calibration value C of the calibration signals Xc may be determined as shown in Equation 6 below.

$$C = N4 \cdot \frac{V2 - V3}{V1 - V2}$$ [Equation 6]

The value (V2−V3)/(V1−V2) may be a constant value determined by the design of the flash cells and the device. Accordingly, in an embodiment, once the calibration circuit 500 has determined N4, the calibration value C may be determined using, for example, a multiplication by a fixed value or a look-up table.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A nonvolatile memory device comprising:
   a memory cell array including:
      a plurality of nonvolatile memory elements configured to store a plurality of weights to be controlled according to a plurality of input signals respectively, and
      a bit line coupled to the plurality of nonvolatile memory elements; and
   a computation output circuit configured to generate a computation signal corresponding to an inner product between an input vector corresponding to the plurality of input signals and a weight vector corresponding to the plurality of weights.

2. The nonvolatile memory device of claim 1, wherein the memory cell array comprises a cell string including the plurality of nonvolatile memory elements connected in series.

3. The nonvolatile memory device of claim 2, wherein each of the plurality of nonvolatile memory elements stores a corresponding weight among the plurality of weights and includes a gate controlled according to a corresponding input signal among the plurality of input signals and a drain coupled to a source of a neighboring nonvolatile memory element.

4. The nonvolatile memory device of claim 2, wherein the memory cell array further includes a bit line selection switch coupling the cell string with the bit line according to a bit line selection signal and a source line selection switch coupling the cell string with a source line according to a source line selection signal.

5. The nonvolatile memory device of claim 1, wherein the computation output circuit includes a first current source configured to provide a constant current to the bit line, and wherein a signal at the bit line is a voltage signal induced by the constant current.

6. The nonvolatile memory device of claim 5, wherein the computation output circuit further includes a second current source configured to generate a computation current according to a voltage of the bit line.

7. The nonvolatile memory device of claim 6, wherein the computation output circuit further comprises a capacitor charged by the computation current.

8. The nonvolatile memory device of claim 7, wherein the computation output circuit further comprises a sampling switch configured to provide a voltage of the bit line to the second current source according to a sampling clock.

9. The nonvolatile memory device of claim 8, wherein the computation output circuit further comprises a reset switch to discharge the capacitor according to a reset signal.

10. The nonvolatile memory device of claim 6, wherein the second current source comprises:
    an operational amplifier configured to amplify difference between voltage of the bit line and a feedback voltage;
    a transistor including a gate receiving an output voltage of the operational amplifier, a source and a drain; and
    a resistor coupled between a power source voltage and one of the source or the drain of the transistor,
    wherein the computation current is provided from one of the source and the drain of the transistor, and
    wherein the feedback voltage is provided from the other of the source and the drain of the transistor.

11. The nonvolatile memory device of claim 1, further comprising an input circuit configured to produce a plurality of pulse input signals respectively corresponding to the plurality of input signals,
    wherein the plurality of pulse input signals are provided to the plurality of nonvolatile memory elements, and
    wherein each of the plurality of pulse input signals is a pulse signal having a pulse width corresponding to a value of a respective input signal.

12. The nonvolatile memory device of claim 1, further comprising:
    a calibration circuit configured to generate a calibration signal according to the plurality of input signals and the plurality of weights.

13. The nonvolatile memory device of claim 12, wherein the memory cell array further comprising a nonvolatile calibration memory element having a predetermined weight and controlled according to the calibration signal, and
    wherein the voltage of the bit line is adjusted according to the calibration signals and the predetermined weight.

14. The nonvolatile memory device of claim 13, further comprising an input circuit configured to:
    convert the plurality of input signals and the calibration signal into a plurality of pulse input signals and a pulse calibration signal, and
    provide the plurality of pulse input signals and the pulse calibration signal to the plurality of nonvolatile memory elements and the nonvolatile calibration memory element,
    wherein each of the plurality of pulse input signals has a pulse width corresponding to a value of a corresponding input signal and the pulse calibration signal has a pulse width corresponding to a value of the calibration signal.

15. The nonvolatile memory device of claim 1, wherein the nonvolatile memory device is a NAND flash memory device.

* * * * *